(12) United States Patent
Akatsuka et al.

(10) Patent No.: US 8,703,007 B2
(45) Date of Patent: Apr. 22, 2014

(54) POLISHING COMPOSITION AND POLISHING METHOD USING THE SAME

(75) Inventors: Tomohiko Akatsuka, Ichinomiya (JP); Yasuto Ishida, Kakamigahara (JP); Kanako Fukuda, Kakamigahara (JP); Yoshihiro Kachi, Minokamo (JP); Hisanori Tansho, Gifu (JP)

(73) Assignee: Fujimi Incorporated, Kiyosu-shi, Aichi (JP)

( * ) Notice: Subject to any disclaimer, the term of this patent is extended or adjusted under 35 U.S.C. 154(b) by 351 days.

(21) Appl. No.: 13/010,033

(22) Filed: Jan. 20, 2011

(65) Prior Publication Data

US 2011/0180511 A1   Jul. 28, 2011

(30) Foreign Application Priority Data

Jan. 25, 2010   (JP) ................................. 2010-013431

(51) Int. Cl.
*C09K 13/00*   (2006.01)
*B44C 1/22*   (2006.01)

(52) U.S. Cl.
USPC ............. 252/79.1; 252/79.4; 216/83; 216/88; 216/89

(58) Field of Classification Search
USPC ...................... 252/79.1, 79.4; 216/83, 88, 89
See application file for complete search history.

(56) References Cited

U.S. PATENT DOCUMENTS

| | | | |
|---|---|---|---|
| 5,575,885 A | 11/1996 | Hirabayashi et al. | |
| 5,770,095 A | 6/1998 | Sasaki et al. | |
| 5,954,997 A | 9/1999 | Kaufman et al. | |
| 6,126,853 A | 10/2000 | Kaufman et al. | |
| 6,428,721 B1 | 8/2002 | Ina et al. | |
| 6,432,828 B2 | 8/2002 | Kaufman et al. | |
| 6,440,186 B1 | 8/2002 | Sakai et al. | |
| 6,679,929 B2 | 1/2004 | Asano et al. | |
| 6,773,476 B2 | 8/2004 | Sakai et al. | |
| 6,814,767 B2 | 11/2004 | Hirano | |
| 6,838,016 B2 | 1/2005 | Sakai et al. | |
| 6,896,825 B1 | 5/2005 | Uchida et al. | |
| 7,232,529 B1 | 6/2007 | Uchida et al. | |
| 7,250,369 B1 | 7/2007 | Uchida et al. | |
| 7,319,072 B2 | 1/2008 | Kurata et al. | |
| 7,485,162 B2 | 2/2009 | Matsuda et al. | |
| 7,550,388 B2 | 6/2009 | Oh et al. | |
| 8,034,252 B2 * | 10/2011 | Yamashita ................... | 252/79.1 |
| 2003/0166337 A1 | 9/2003 | Wang et al. | |
| 2003/0228762 A1 | 12/2003 | Moeggenborg et al. | |
| 2004/0084414 A1 | 5/2004 | Sakai et al. | |
| 2004/0148867 A1 | 8/2004 | Matsumi | |
| 2005/0050803 A1 | 3/2005 | Amanokura et al. | |
| 2007/0176140 A1 | 8/2007 | Matsuda et al. | |
| 2008/0032505 A1 | 2/2008 | Kawamura et al. | |
| 2008/0105652 A1 | 5/2008 | Brusic et al. | |
| 2008/0265205 A1 | 10/2008 | Oh et al. | |
| 2009/0173910 A1 | 7/2009 | Hirano et al. | |
| 2009/0179172 A1 | 7/2009 | Hirano et al. | |
| 2009/0203215 A1 * | 8/2009 | Yoshikawa et al. ........... | 438/693 |
| 2009/0209104 A1 * | 8/2009 | Kimura ......................... | 438/693 |
| 2009/0239380 A1 * | 9/2009 | Tomiga et al. ................ | 438/693 |
| 2009/0289217 A1 * | 11/2009 | Sato et al. ..................... | 252/79.4 |
| 2009/0291620 A1 * | 11/2009 | Kunitani et al. ................ | 451/28 |
| 2009/0302266 A1 * | 12/2009 | Takemura et al. ........... | 252/79.1 |
| 2009/0311864 A1 * | 12/2009 | Yamada et al. ............... | 438/693 |

FOREIGN PATENT DOCUMENTS

| | | |
|---|---|---|
| EP | 1 520 892 A2 | 4/2005 |
| JP | 2002-110595 | 4/2002 |
| JP | 2005-109256 | 4/2005 |
| JP | 2005-306977 | 11/2005 |
| JP | 2007-053213 | 3/2007 |
| JP | 2008-041781 | 2/2008 |
| JP | 2009-283751 | 12/2009 |
| WO | 2004/033574 A1 | 4/2004 |
| WO | 2007/026862 A1 | 3/2007 |
| WO | 2008/057593 | 5/2008 |

OTHER PUBLICATIONS

Yamashita, STN search report, 2007, pp. 57-58.*

* cited by examiner

*Primary Examiner* — Shamim Ahmed
(74) *Attorney, Agent, or Firm* — Vidas, Arrett & Steinkraus

(57) ABSTRACT

A polishing composition of the present invention contains an oxidant, an anticorrosive, and a surfactant comprising a compound represented by Chemical Formula 1:

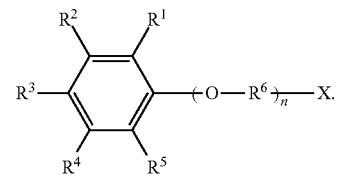

One to three of $R^1$ to $R^5$ in Chemical Formula 1 are alkyl groups, alkynyl groups, alkenyl groups, aryl groups, or arylalkylene groups, one is a hydrogen atom or an alkyl group having 1 to 9 carbon atoms, and the remainder are hydrogen atoms. $O-R^6$ is oxyethylene, oxypropylene, or a random or block conjugate of oxyethylene and oxypropylene. n is an integer of 1 or more. X is an $OSO_3^-$ group, an $OPO_3^{2-}$ group, or an OH group.

16 Claims, 1 Drawing Sheet

POLISHING COMPOSITION AND POLISHING METHOD USING THE SAME

BACKGROUND OF THE INVENTION

The present invention relates to a polishing composition to be used in polishing, for example, for forming the wiring of a semiconductor device.

When the wiring of a semiconductor device is formed, firstly, a barrier layer and a conductor layer are sequentially formed in this order on an insulator layer having trenches therein. After that, at least portions of the conductor layer (outside portions of the conductor layer), which is positioned outside the trenches, and portions of the barrier layer (outside portions of the barrier layer), which is positioned outside the trenches, are removed by chemical mechanical polishing. A polishing process for removing at least the outside portions of the conductor layer and the outside portions of the barrier layer is usually conducted by divided steps of the first polishing step and the second polishing step. In the first polishing step, a part of the outside portions of the conductor layer is removed so as to expose the upper surface of the barrier layer to the outside. In the subsequent second polishing step, at least the remaining outside portions of the conductor layer and the outside portion of the barrier layer are removed so as to expose the insulator layer to the outside and obtain a flat surface.

It has been proposed to use a polishing composition containing a surfactant so as to improve the flatness of an object to be polished after having been polished as a polishing composition to be used in such polishing for forming the wiring of a semiconductor device and particularly in polishing of the second polishing step. Japanese Laid-Open Patent Publication No. 2008-41781 discloses a polishing composition containing an anionic surfactant such as ammonium polyoxyethylene lauryl ether sulfate, an anticorrosive such as benzotriazole, and a nonionic surfactant such as a polyoxyethylene alkyl ether. International Publication No. WO 2007/026862 discloses use of a surfactant such as a polyoxyethylene alkyl ether acetate and a polyoxyethylene alkyl ether phosphate in combination with at least one compound selected from benzotriazole and benzotriazole derivatives. Japanese Laid-Open Patent Publication No. 2005-109256 also discloses a polishing composition containing various surfactants.

However, the above described conventional polishing compositions aim at improving particularly the flatness of an object to be polished after having been polished, and have been insufficient in the point of reducing surface defects of the object to be polished that are formed due to polishing.

SUMMARY OF THE INVENTION

Accordingly, it is an objective of the present invention to provide a polishing composition that improves the flatness of an object to be polished after having been polished, and reduces surface defects of the object to be polished that are formed due to polishing, and a method for polishing an object to be polished using such a polishing composition.

In order to achieve the above described objective, in accordance with one aspect of the present invention, there is provided a polishing composition containing an oxidant, an anticorrosive, and a surfactant. The surfactant is a compound represented by Chemical Formula 1:

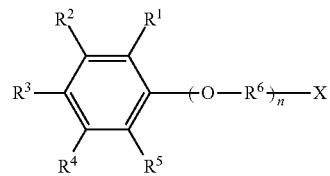

wherein one to three of $R^1$ to $R^5$ are alkyl groups, alkynyl groups, alkenyl groups, aryl groups, or arylalkylene groups, one is a hydrogen atom or an alkyl group having 1 to 9 carbon atoms, and the remainder are hydrogen atoms, $O-R^6$ is oxyethylene, oxypropylene, or a random or block conjugate of oxyethylene and oxypropylene, n is an integer of 1 or more, and X is an $OSO_3^-$ group, an $OPO_3^{2-}$ group, or an OH group.

One to three of $R^1$ to $R^5$ in Chemical Formula 1 are preferably functional groups represented by Chemical Formula 2:

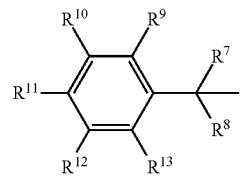

wherein $R^7$ to $R^{13}$ are hydrogen atoms or methyl groups.

X in Chemical Formula 1 is preferably an $OSO_{3-}$ group or an $OPO_3^{2-}$ group.

In another aspect of the present invention, there is provided a method for polishing a copper-containing surface of an object to be polished, by using the polishing composition according to the above described aspect of the present invention.

According to the present invention, there is provided a polishing composition that improves the flatness of an object to be polished after having been polished, and reduces surface defects of the object to be polished that are formed due to polishing, and a method for polishing an object to be polished using such a polishing composition.

DETAILED DESCRIPTION OF THE PREFERRED EMBODIMENTS

Figure 1A:
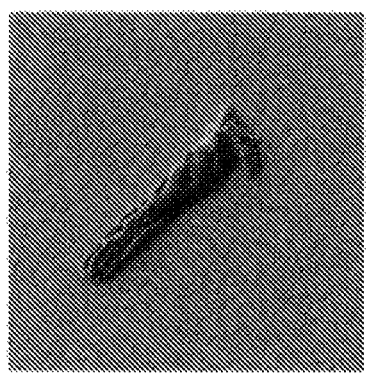
FIGS. 1(a) and 1(b) are scanning electron microscope photographs illustrating examples of defects that are observed on the surface of a copper blanket wafer after having been polished by using polishing compositions according to Examples of the present invention and Comparative Examples.

One embodiment of the present invention will be described below.

A polishing composition according to the present embodiment is prepared by mixing an oxidant, an anticorrosive, and a surfactant, preferably together with abrasive grains and an acid, in a solvent such as water. Accordingly, the polishing composition contains the oxidant, the anticorrosive, and the surfactant, and preferably further contains the abrasive grains and the acid. This polishing composition is used mainly in an application of polishing for forming the wiring of a semiconductor device, and particularly of polishing the copper-containing surface of an object to be polished.

<Oxidant>

An oxidant contained in the polishing composition has the function of oxidizing the surface of an object to be polished. This function of the oxidant increases the rate of polishing the object to be polished by the polishing composition.

A usable oxidant is not limited in particular. Specific examples thereof include a peroxide such as hydrogen peroxide, a nitrate, an iodate, a periodate, a hypochlorite, a chlorite, a chlorate, a perchlorate, a persulfate, a dichromate, a permanganate, ozone water, a silver (II) salt, and an iron (III) salt, but the preferable example is hydrogen peroxide.

The content of the oxidant in the polishing composition is preferably 0.1 g/L or more, more preferably is 0.5 g/L or more, and further preferably is 1 g/L or more. As the content of the oxidant increases, the rate of polishing the object to be polished by the polishing composition is more increased.

The content of the oxidant in the polishing composition is also preferably 30 g/L or less, more preferably is 25 g/L or less, and further preferably is 20 g/L or less. As the content of the oxidant decreases, the material cost of the polishing composition is more reduced and besides, the load of the treatment of the polishing composition that has been used for polishing, in other words, the load of the treatment of a waste is more reduced.

<Anticorrosive>

An anticorrosive contained in the polishing composition alleviates the oxidation of the surface of an object to be polished due to the oxidant, and also reacts with metal ions that are formed by the oxidation of a metal on the surface of the object to be polished due to the oxidant to produce an insoluble complex. This function of the anticorrosive enhances the flatness of the surface of the object to be polished after having been polished by using the polishing composition.

A usable anticorrosive is not limited in particular, but is preferably a heterocyclic compound. The number of members of the heterocycle in the heterocyclic compound is not limited in particular. In addition, the heterocyclic compound may be a monocyclic compound or a polycyclic compound having a condensed ring. Specific examples of the heterocyclic compound include a nitrogen-containing heterocyclic compound such as pyrrole, pyrazole, imidazole, triazole, tetrazole, pyridine, pyrazine, pyridazine, pyrindine, indolizine, indole, isoindole, indazole, purine, quinolizine, quinoline, isoquinoline, naphthyridine, phthalazine, quinoxaline, quinazoline, cinnoline, pteridine, triazole, isothiazole, oxazole, isoxazole, and furazan.

Examples of pyrazole include 1H-pyrazole, 4-nitro-3-pyrazolecarboxylic acid, 3,5-pyrazolecarboxylic acid, 3-amino-5-phenylpyrazole, 5-amino-3-phenylpyrazole, 3,4,5-tribromopyrazole, 3-aminopyrazole, 3,5-dimethylpyrazole, 3,5-dimethyl-1-hydroxymethylpyrazole, 3-methylpyrazole, 1-methylpyrazole, 3-amino-5-methylpyrazole, 4-amino-pyrazolo[3,4-d]pyrimidine, allopurinol, 4-chloro-1H-pyrazolo[3,4-D]pyrimidine, 3,4-dihydroxy-6-methyl pyrazolo(3,4-B)-pyridine, and 6-methyl-1H-pyrazolo[3,4-b]pyridine-3-amine.

Examples of imidazole include imidazole, 1-methylimidazole, 2-methylimidazole, 4-methylimidazole, 1,2-dimethylpyrazole, 2-ethyl-4-methylimidazole, 2-isopropylimidazole, benzimidazole, 5,6-dimethyl benzimidazole, 2-aminobenzimidazole, 2-chlorobenzimidazole, 2-methyl benzimidazole, 2-(1-hydroxyethyl)benzimidazole, 2-hydroxybenzimidazole, 2-phenyl benzimidazole, 2,5-dimethyl benzimidazole, 5-methyl benzimidazole, 5-nitrobenzimidazole, and 1H-purine.

Examples of triazole include 1,2,3-triazole, 1,2,4-triazole, 1-methyl-1,2,4-triazole, methyl-1H-1,2,4-triazole-3-carboxylate, 1,2,4-triazole-3-carboxylic acid, 1,2,4-triazole-3-methyl carboxylate, 1H-1,2,4-triazole-3-thiol, 3,5-diamino-1H-1,2,4-triazole, 3-amino-1,2,4-triazole-5-thiol, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1,2,4-triazole-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5-diheptyl-4H-1,2,4-triazole, 5-methyl-1,2,4-triazole-3,4-diamine, 1H-benzotriazole, 1-hydroxybenzotriazole, 1-aminobenzotriazole, 1-carboxybenzotriazole, 5-chloro-1H-benzotriazole, 5-nitro-1H-benzotriazole, 5-carboxy-1H-benzotriazole, 5-methyl-1H-benzotriazole, 5,6-dimethyl-1H-benzotriazole, 1-(1',2'-dicarboxyethyl)benzotriazole, 1-[N,N-bis(hydroxyethyl)aminomethyl]benzotriazole, and 1-[N,N-bis(hydroxyethyl)aminomethyl]-5-methyl benzotriazole.

Examples of tetrazole include 1H-tetrazole, 5-methyl tetrazole, 5-aminotetrazole, 5-phenyl tetrazole, 1-methyl-5-mercapto-tetrazole, 1-phenyl-5-mercapto-tetrazole, 1-[2-(dimethylamino)ethyl]-5-mercapto-tetrazole, 2-methoxy-5-[5-(trifluoromethyl)tetrazole-1-yl]benzaldehyde, 5,5'-bitetrazole, 4,5-bis(1H-tetrazole-5-yl)-1,2,3-triazole, 5-[4-methyl-(1,1'-biphenyl)-2-yl]tetrazole, and 5-[4-methyl-(1,1'-biphenyl)-2-yl]-2-triphenylmethyl-2H-tetrazole.

Examples of indazole include 1H-indazole, 5-amino-1H-indazole, 5-nitro-1H-indazole, 5-hydroxy-1H-indazole, 6-amino-1H-indazole, 6-nitro-1H-indazole, 6-hydroxy-1H-indazole, and 3-carboxy-5-methyl-1H-indazole.

Examples of indole include 1H-indole, 1-methyl-1H-indole, 2-methyl-1H-indole, 3-methyl-1H-indole, 4-methyl-1H-indole, 5-methyl-1H-indole, 6-methyl-1H-indole, 7-methyl-1H-indole, 4-amino-1H-indole, 5-amino-1H-indole, 6-amino-1H-indole, 7-amino-1H-indole, 4-hydroxy-1H-indole, 5-hydroxy-1H-indole, 6-hydroxy-1H-indole, 7-hydroxy-1H-indole, 4-methoxy-1H-indole, 5-methoxy-1H-indole, 6-methoxy-1H-indole, 7-methoxy-1H-indole, 4-chloro-1H-indole, 5-chloro-1H-indole, 6-chloro-1H-indole, 7-chloro-1H-indole, 4-carboxy-1H-indole, 5-carboxy-1H-indole, 6-carboxy-1H-indole, 7-carboxy-1H-indole, 4-nitro-1H-indole, 5-nitro-1H-indole, 6-nitro-1H-indole, 7-nitro-1H-indole, 4-nitrile-1H-indole, 5-nitrile-1H-indole, 6-nitrile-1H-indole, 7-nitrile-1H-indole, 2,5-dimethyl-1H-indole, 1,2-dimethyl-1H-indole, 1,3-dimethyl-1H-indole, 2,3-dimethyl-1H-indole, 5-amino-2,3-dimethyl-1H-indole, 7-ethyl-1H-indole, 5-(aminomethyl)indole, 2-methyl-5-amino-1H-indole, 3-hydroxymethyl-1H-indole, 6-isopropyl-1H-indole, and 5-chloro-2-methyl-1H-indole.

Among them, preferable anticorrosives are 3-amino-5-phenylpyrazole, 1H-benzotriazole, 5-methyl-1H-benzotriazole, 5,6-dimethyl-1H-benzotriazole, 1-[N,N-bis(hydroxyethyl)aminomethyl]-5-methyl benzotriazole, 1,2,4-triazole, and 5-nitro-1H-indole.

The content of the anticorrosive in the polishing composition is preferably 0.001 g/L or more, more preferably is 0.01 g/L or more, and further preferably is 0.1 g/L or more. As the content of the anticorrosive increases, the flatness of the surface of the object to be polished after having been polished by using the polishing composition is more enhanced.

The content of the anticorrosive in the polishing composition is also preferably 5 g/L or less, more preferably is 2 g/L or less, and further preferably is 1 g/L or less. As the content of the anticorrosive decreases, the rate of polishing the object to be polished by the polishing composition is more increased.

<Surfactant>

The function of a surfactant contained in the polishing composition is as follows. Metal ions formed by the oxidation of a metal on the surface of an object to be polished due to the oxidant react with the anticorrosive to produce an insoluble complex. It is considered that one reason of surface defects of the object to be polished that are formed due to polishing is the deposition of this insoluble complex on the surface of the object to be polished. The surfactant adsorbs onto the surface of this insoluble complex, hydrophilizes the hydrophobic surface of the insoluble complex, and makes it difficult for the insoluble complex to deposit on the surface of the object to be polished. Accordingly, the function of the surfactant that hydrophilizes the hydrophobic surface of the insoluble complex reduces the surface defects of the object to be polished after having been polished by using the polishing composition.

A usable surfactant is a compound represented by Chemical Formula 1:

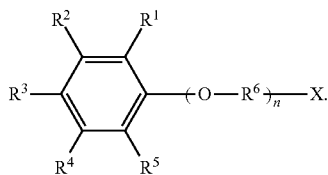

One to three of $R^1$ to $R^5$ in Chemical Formula 1 are alkyl groups, alkynyl groups, alkenyl groups, aryl groups, or arylalkylene groups, one is a hydrogen atom or an alkyl group having 1 to 9 carbon atoms, and the remainder are hydrogen atoms. In addition, $O\text{---}R^6$ is oxyethylene, oxypropylene, or a random or block conjugate of oxyethylene and oxypropylene, n is an integer of 1 or more, and X is an $OSO_{3\_}$ group, an $OPO_3^{2-}$ group or an OH group.

When X is an $OSO_{3\_}$ group or an $OPO_3^{2-}$ group, the compound represented by Chemical Formula 1 is an anionic surfactant. The anionic surfactant has the advantage of having a particularly strong function of enhancing the dispersibility of abrasive grains, which are optionally contained in the polishing composition.

One to three of $R^1$ to $R^5$ in Chemical Formula 1 are preferably arylalkylene groups, that is, functional groups represented by Chemical Formula 2:

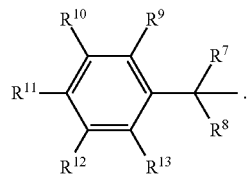

$R^7$ to $R^{13}$ in Chemical Formula 2 are hydrogen atoms or methyl groups. In this case, the effect of the surfactant of reducing the surface defects is further enhanced.

Specific examples of the compound represented by Chemical Formula 1 includes: a first compound group consisting of ethylene glycol monophenyl ether, diethylene glycol monophenyl ether, polyoxyethylene monophenyl ether, polyoxyethylene monomethylphenyl ether, polyoxyethylene butylphenyl ether, polyoxyethylene nonylphenyl ether, propylene glycol monophenyl ether, dipropylene glycol monophenyl ether, polyoxypropylene monophenyl ether, polyoxypropylene monomethylphenyl ether, polyoxypropylene butylphenyl ether, polyoxypropylene nonylphenyl ether, polyoxyethylene polyoxypropylene monophenyl ether, polyoxyethylene polyoxypropylene monomethylphenyl ether, polyoxyethylene polyoxypropylene butylphenyl ether, polyoxyethylene polyoxypropylene nonylphenyl ether, ethylene glycol monophenyl ether sulfate, diethylene glycol monophenyl ether sulfate, polyoxyethylene monophenyl ether sulfate, polyoxyethylene monomethylphenyl ether sulfate, polyoxyethylene butylphenyl ether sulfate, polyoxyethylene nonylphenyl ether sulfate, propylene glycol monophenyl ether sulfate, dipropylene glycol monophenyl ether sulfate, polyoxypropylene monophenyl ether sulfate, polyoxypropylene monomethylphenyl ether sulfate, polyoxypropylene butylphenyl ether sulfate, polyoxypropylene nonylphenyl ether sulfate, polyoxyethylene polyoxypropylene monophenyl ether sulfate, polyoxyethylene polyoxypropylene monomethylphenyl ether sulfate, polyoxyethylene polyoxypropylene butylphenyl ether sulfate, polyoxyethylene polyoxypropylene nonylphenyl ether sulfate, ethylene glycol monophenyl ether phosphate, diethylene glycol monophenyl ether phosphate, polyoxyethylene monophenyl ether phosphate, polyoxyethylene monomethylphenyl ether phosphate, polyoxyethylene butylphenyl ether phosphate, polyoxyethylene nonylphenyl ether phosphate, propylene glycol monophenyl ether phosphate, dipropylene glycol monophenyl ether phosphate, polyoxypropylene monophenyl ether phosphate, polyoxypropylene monomethylphenyl ether phosphate, polyoxypropylene butylphenyl ether phosphate, polyoxypropylene nonylphenyl ether phosphate, polyoxyethylene polyoxypropylene monophenyl ether phosphate, polyoxyethylene polyoxypropylene monomethylphenyl ether phosphate, polyoxyethylene polyoxypropylene butylphenyl ether phosphate, and polyoxyethylene polyoxypropylene nonylphenyl ether phosphate; a second compound group consisting of polyoxyethylene monostyrylphenyl ether, polyoxyethylene monostyrylmethylphenyl ether, polyoxyethylene monostyrylbutylphenyl ether, polyoxyethylene monostyrylnonylphenyl ether, polyoxyethylene monomethylstyrylphenyl ether, polyoxyethylene monomethylstyrylmethylphenyl ether, polyoxyethylene monomethylstyrylbutylphenyl ether, polyoxyethylene monomethylstyrylnonylphenyl ether, polyoxyethylene distyrylphenyl ether, polyoxyethylene distyrylmethylphenyl ether, polyoxyethylene distyrylbutylphenyl ether, polyoxyethylene distyrylnonylphenyl ether, polyoxyethylene dimethylstyrylphenyl ether, polyoxyethylene dimethylstyrylmethylphenyl ether, polyoxyethylene dimethylstyrylbutylphenyl ether, polyoxyethylene dimethylstyrylnonylphenyl ether, polyoxyethylene tristyrylphenyl ether, polyoxyethylene tristyrylmethylphenyl ether, polyoxyethylene tristyrylbutylphenyl ether, polyoxyethylene tristyrylnonylphenyl ether, polyoxyethylene trimethylstyrylphenyl ether, polyoxyethylene trimethylstyrylmethylphenyl ether, polyoxyethylene trimethylstyrylbutylphenyl ether, polyoxyethylene trimethylstyrylnonylphenyl ether, polyoxyethylene cumylphenyl ether, polyoxypropylene monostyrylphenyl ether, polyoxypropylene monostyrylmethylphenyl ether, polyoxypropylene monostyrylbutylphenyl ether, polyoxypropylene monostyrylnonylphenyl ether, polyoxypropylene monomethylstyrylphenyl ether, polyoxypropylene monomethylstyrylmethylphenyl ether, polyoxypropylene monomethylstyrylbutylphenyl ether, polyoxypropylene monomethylstyrylnonylphenyl ether, polyoxypropylene distyrylphenyl ether, polyoxypropylene distyrylmethylphenyl ether, polyoxypropylene distyrylbutylphenyl ether, polyoxypropylene distyrylnonylphenyl ether, polyoxypropylene dimethylstyrylphenyl ether, polyoxypropylene dimethylstyrylmethylphenyl ether, polyoxypropylene dimethylstyrylbutylphenyl ether, polyoxypropylene dimethylstyrylnonylphenyl ether, polyoxypropylene tristyrylphenyl ether, polyoxypropylene tristyrylmethylphenyl ether, polyoxypropylene tristyrylbutylphenyl ether, polyoxypropylene tristyrylnonylphenyl ether, polyoxypropylene trimethylstyrylphenyl ether, polyoxypropylene trimethylstyrylmethylphenyl ether, polyoxypropylene trimethylstyrylbutylphenyl ether, polyoxypropylene trimethylstyrylnonylphenyl ether, polyoxypropylene cumylphenyl ether, polyoxyethylene polyoxypropylene monostyrylphenyl ether, polyoxyethylene polyoxypropylene monostyrylmethylphenyl ether, polyoxyethylene polyoxypropylene monostyrylbutylphenyl ether, polyoxyethylene polyoxypropylene monostyrylnonylphenyl ether, polyoxyethylene polyoxypropylene monomethylstyrylphenyl ether, polyoxyethylene polyoxypropylene monomethylstyrylmethylphenyl ether, polyoxyethylene polyoxypropylene monomethylstyrylbutylphenyl ether, polyoxyethylene polyoxypropylene monomethylstyrylnonylphenyl ether, polyoxyethylene polyoxypropylene distyrylphenyl ether, polyoxyethylene polyoxypropylene distyrylmethylphenyl ether, polyoxyethylene polyoxypropylene distyrylbutylphenyl ether, polyoxyethylene polyoxypropylene distyrylnonylphenyl ether, polyoxyethylene polyoxypropylene dimethylstyrylphenyl ether, polyoxyethylene polyoxypropylene dimethylstyrylmethylphenyl ether, polyoxyethylene polyoxypropylene dimethylstyrylbutylphenyl ether, polyoxyethylene polyoxypropylene dimethylstyrylnonylphenyl ether, polyoxyethylene polyoxypropylene tristyrylphenyl ether, polyoxyethylene polyoxypropylene tristyrylmethylphenyl ether, polyoxyethylene polyoxypropylene tristyrylbutylphenyl ether, polyoxyethylene polyoxypropylene tristyrylnonylphenyl ether, polyoxyethylene polyoxypropylene trimethylstyrylphenyl ether, polyoxyethylene polyoxypropylene trimethylstyrylmethylphenyl ether, polyoxyethylene polyoxypropylene trimethylstyrylbutylphenyl ether, polyoxyethylene polyoxypropylene trimethylstyrylnonylphenyl ether, and polyoxyethylene polyoxypropylene cumylphenyl ether; and a third compound group consisting of polyoxyethylene monostyrylmethylphenyl ether sulfate, polyoxyethylene monostyrylbutylphenyl ether sulfate, polyoxyethylene monostyrylnonylphenyl ether sulfate, polyoxyethylene monomethylstyrylphenyl ether sulfate, polyoxyethylene monomethylstyrylmethylphenyl ether sulfate, polyoxyethylene monomethylstyrylbutylphenyl ether sulfate, polyoxyethylene monomethylstyrylnonylphenyl ether sulfate, polyoxyethylene cumylphenyl ether sulfate, polyoxyethylene distyrylmethylphenyl ether sulfate, polyoxyethylene distyrylbutylphenyl ether sulfate, polyoxyethylene distyrylnonylphenyl ether sulfate, polyoxyethylene dimethylstyrylphenyl ether sulfate, polyoxyethylene dimethylstyrylmethylphenyl ether sulfate, polyoxyethylene dimethylstyrylbutylphenyl ether sulfate, polyoxyethylene dimethylstyrylnonylphenyl ether sulfate, polyoxyethylene tristyrylmethylphenyl ether sulfate, polyoxyethylene tristyrylbutylphenyl ether sulfate, polyoxyethylene tristyrylnonylphenyl ether sulfate, polyoxyethylene trimethylstyrylphenyl ether sulfate, polyoxyethylene trimethylstyrylmethylphenyl ether sulfate, polyoxyethylene trimethylstyrylbutylphenyl ether sulfate, polyoxyethylene trimethylstyrylnonylphenyl ether sulfate, polyoxypropylene monostyrylmethylphenyl ether sulfate, polyoxypropylene monostyrylbutylphenyl ether sulfate, polyoxypropylene monostyrylnonylphenyl ether sulfate, polyoxypropylene monomethylstyrylphenyl ether sulfate, polyoxypropylene monomethylstyrylmethylphenyl ether sulfate, polyoxypropylene monomethylstyrylbutylphenyl ether sulfate, polyoxypropylene monomethylstyrylnonylphenyl ether sulfate, polyoxypropylene distyrylmethylphenyl ether sulfate, polyoxypropylene distyrylbutylphenyl ether sulfate, polyoxypropylene distyrylnonylphenyl ether sulfate, polyoxypropylene dimethylstyrylphenyl ether sulfate, polyoxypropylene dimethylstyrylmethylphenyl ether sulfate, polyoxypropylene dimethylstyrylbutylphenyl ether sulfate, polyoxypropylene dimethylstyrylnonylphenyl ether sulfate, polyoxypropylene tristyrylmethylphenyl ether sulfate, polyoxypropylene tristyrylbutylphenyl ether sulfate, polyoxypropylene tristyrylnonylphenyl ether sulfate, polyoxypropylene trimethylstyrylphenyl ether sulfate, polyoxypropylene trimethylstyrylmethylphenyl ether sulfate, polyoxypropylene trimethylstyrylbutylphenyl ether sulfate, polyoxypropylene trimethylstyrylnonylphenyl ether sulfate, polyoxypropylene cumylphenyl ether sulfate, polyoxyethylene polyoxypropylene monostyrylmethylphenyl ether sulfate, polyoxyethylene polyoxypropylene monostyrylbutylphenyl ether sulfate, polyoxyethylene polyoxypropylene monostyrylnonylphenyl ether sulfate, polyoxyethylene polyoxypropylene monomethylstyrylphenyl ether sulfate, polyoxyethylene polyoxypropylene monomethylstyrylmethylphenyl ether sulfate, polyoxyethylene polyoxypropylene monomethylstyrylbutylphenyl ether sulfate, polyoxyethylene polyoxypropylene monomethylstyrylnonylphenyl ether sulfate, polyoxyethylene polyoxypropylene distyrylmethylphenyl ether sulfate, polyoxyethylene polyoxypropylene distyrylbutylphenyl ether sulfate, polyoxyethylene polyoxypropylene distyrylnonylphenyl ether sulfate, polyoxyethylene polyoxypropylene dimethylstyrylphenyl ether sulfate, polyoxyethylene polyoxypropylene dimethylstyrylmethylphenyl ether sulfate, polyoxyethylene polyoxypropylene dimethylstyrylbutylphenyl ether sulfate, polyoxyethylene polyoxypropylene dimethylstyrylnonylphenyl ether sulfate, polyoxyethylene polyoxypropylene tristyrylmethylphenyl ether sulfate, polyoxyethylene polyoxypropylene tristyrylbutylphenyl ether sulfate, polyoxyethylene polyoxypropylene tristyrylnonylphenyl ether sulfate, polyoxyethylene polyoxypropylene trimethylstyrylphenyl ether sulfate, polyoxyethylene polyoxypropylene trimethylstyrylmethylphenyl ether sulfate, polyoxyethylene polyoxypropylene trimethylstyrylbutylphenyl ether sulfate, polyoxyethylene polyoxypropylene trimethylstyrylnonylphenyl ether sulfate, polyoxyethylene polyoxypropylene cumylphenyl ether sulfate, polyoxyethylene monostyrylmethylphenyl ether phosphate, polyoxyethylene monostyrylbutylphenyl ether phosphate, polyoxyethylene monostyrylnonylphenyl ether phosphate, polyoxyethylene monomethylstyrylphenyl ether phosphate, polyoxyethylene monomethylstyrylmethylphenyl ether phosphate, polyoxyethylene monomethylstyrylbutylphenyl ether phosphate, polyoxyethylene monomethylstyrylnonylphenyl ether phosphate, polyoxyethylene cumylphenyl ether phosphate, polyoxyethylene distyrylmethylphenyl ether phosphate, polyoxyethylene distyrylbutylphenyl ether phosphate, polyoxyethylene distyrylnonylphenyl ether phosphate, polyoxyethylene dimethylstyrylphenyl ether phosphate, polyoxyethylene dimethylstyrylmethylphenyl ether phosphate, polyoxyethylene dimethylstyrylbutylphenyl ether phosphate, polyoxyethylene dimethylstyrylnonylphenyl ether phosphate, polyoxyethylene tristyrylmethylphenyl ether phosphate, polyoxyethylene tristyrylbutylphenyl ether phosphate, polyoxyethylene tristyrylnonylphenyl ether phosphate, polyoxyethylene trimethylstyrylphenyl ether phosphate, polyoxyethylene trimethylstyrylmethylphenyl ether phosphate, polyoxyethylene trimethylstyrylbutylphenyl ether phosphate, polyoxyethylene trimethylstyrylnonylphenyl ether phosphate, polyoxypropylene monostyrylmethylphenyl ether phosphate, polyoxypropylene monostyrylbutylphenyl ether phosphate, polyoxypropylene monostyrylnonylphenyl ether phosphate, polyoxypropylene monomethylstyrylphenyl ether phosphate, polyoxypropylene monomethylstyrylmethylphenyl ether phosphate, polyoxypropylene monomethylstyrylbutylphenyl ether phosphate, polyoxypropylene monomethylstyrylnonylphenyl ether phosphate, polyoxypropylene distyrylmethylphenyl ether phosphate, polyoxypropylene distyrylbutylphenyl ether phosphate, polyoxypropylene distyrylnonylphenyl ether phosphate, polyoxypropylene dimethylstyrylphenyl ether phosphate, polyoxypropylene dimethylstyrylmethylphenyl ether phosphate, polyoxypropylene dimethylstyrylbutylphenyl ether phosphate, polyoxypropylene dimethylstyrylnonylphenyl ether phosphate, polyoxypropylene tristyrylmethylphenyl ether phosphate, polyoxypropylene tristyrylbutylphenyl ether phosphate, polyoxypropylene tristyrylnonylphenyl ether phosphate, polyoxypropylene trimethylstyrylphenyl ether phosphate, polyoxypropylene trimethylstyrylmethylphenyl ether phosphate, polyoxypropylene trimethylstyrylbutylphenyl ether phosphate, polyoxypropylene trimethylstyrylnonylphenyl ether phosphate, polyoxypropylene cumylphenyl ether phosphate, polyoxyethylene polyoxypropylene monostyrylmethylphenyl ether phosphate, polyoxyethylene polyoxypropylene monostyrylbutylphenyl ether phosphate, polyoxyethylene polyoxypropylene monostyrylnonylphenyl ether phosphate, polyoxyethylene polyoxypropylene monomethylstyrylphenyl ether phosphate, polyoxyethylene polyoxypropylene monomethylstyrylmethylphenyl ether phosphate, polyoxyethylene polyoxypropylene monomethylstyrylbutylphenyl ether phosphate, polyoxyethylene polyoxypropylene monomethylstyrylnonylphenyl ether phosphate, polyoxyethylene polyoxypropylene distyrylmethylphenyl ether phosphate, polyoxyethylene polyoxypropylene distyrylbutylphenyl ether phosphate, polyoxyethylene polyoxypropylene distyrylnonylphenyl ether phosphate, polyoxyethylene polyoxypropylene dimethylstyrylphenyl ether phosphate, polyoxyethylene polyoxypropylene dimethylstyrylmethylphenyl ether phosphate, polyoxyethylene polyoxypropylene dimethylstyrylbutylphenyl ether phosphate, polyoxyethylene polyoxypropylene dimethylstyrylnonylphenyl ether phosphate, polyoxyethylene polyoxypropylene tristyrylmethylphenyl ether phosphate, polyoxyethylene polyoxypropylene tristyrylbutylphenyl ether phosphate, polyoxyethylene polyoxypropylene tristyrylnonylphenyl ether phosphate, polyoxyethylene polyoxypropylene trimethylstyrylphenyl ether phosphate, polyoxyethylene polyoxypropylene trimethylstyrylmethylphenyl ether phosphate, polyoxyethylene polyoxypropylene trimethylstyrylbutylphenyl ether phosphate, polyoxyethylene polyoxypropylene trimethylstyrylnonylphenyl ether phosphate, polyoxyethylene polyoxypropylene cumylphenyl ether phosphate, polyoxyethylene monostyrylphenyl ether sulfate, polyoxyethylene distyrylphenyl ether sulfate, polyoxyethylene tristyrylphenyl ether sulfate, polyoxypropylene monostyrylphenyl ether sulfate, polyoxypropylene distyrylphenyl ether sulfate, polyoxypropylene tristyrylphenyl ether sulfate, polyoxyethylene polyoxypropylene monostyrylphenyl ether sulfate, polyoxyethylene polyoxypropylene distyrylphenyl ether sulfate, polyoxyethylene polyoxypropylene tristyrylphenyl ether sulfate, polyoxyethylene monostyrylphenyl ether phosphate, polyoxyethylene distyrylphenyl ether phosphate, polyoxyethylene tristyrylphenyl ether phosphate, polyoxypropylene monostyrylphenyl ether phosphate, polyoxypropylene distyrylphenyl ether phosphate, polyoxypropylene tristyrylphenyl ether phosphate, polyoxyethylene polyoxypropylene monostyrylphenyl ether phosphate, polyoxyethylene polyoxypropylene distyrylphenyl ether phosphate, and polyoxyethylene polyoxypropylene tristyrylphenyl ether phosphate.

Among them, preferable surfactants are compounds in which one to three of $R^1$ to $R^5$ in Chemical Formula 1 are functional groups represented by Chemical Formula 2, in other words, are the second and third compound groups. In this case, a higher effect of reducing the surface defects is obtained. In the case of a compound in which one to three of $R^1$ to $R^5$ in Chemical Formula 1 are functional groups represented by Chemical Formula 2, and X in Chemical Formula 1 is an $OSO_{3-}$ group or an $OPO_3^{2-}$ group, in other words, in the case where any one of the third compound group is used, a stronger effect of dispersing the abrasive grains is also obtained. Any of the third compound group is a styrylated polyoxyalkylene phenyl ether sulfate or a styrylated polyoxyalkylene phenyl ether phosphate.

The content of the surfactant in the polishing composition is preferably 0.0001 g/L or more, more preferably is 0.001 g/L or more, and further preferably is 0.01 g/L or more. As the content of the surfactant increases, the surface defects of the object to be polished after having been polished by using the polishing composition are more reduced.

The content of the surfactant in the polishing composition is also preferably 10 g/L or less, more preferably is 5 g/L or less, and further preferably is 1 g/L or less. As the content of the surfactant decreases, the rate of polishing the object to be polished by the polishing composition is more increased.

<Abrasive Grain>

Abrasive grains optionally contained in the polishing composition have the function of mechanically polishing the surface of an object to be polished. This function of the abrasive grains increases the rate of polishing the object to be polished by the polishing composition.

Usable abrasive grains are not limited in particular, but are preferably silica and are particularly colloidal silica.

The content of the abrasive grains in the polishing composition is preferably 1% by mass or more, more preferably is 3% by mass or more, and further preferably is 5% by mass or more. As the content of the abrasive grains increases, the rate of polishing the object to be polished by the polishing composition is more increased.

The content of the abrasive grains in the polishing composition is also preferably 20% by mass or less, more preferably is 15% by mass or less, and further preferably is 10% by mass or less. As the content of the abrasive grains decreases, the material cost of the polishing composition is more reduced.

The average primary particle size of the abrasive grains is preferably 5 nm or more, more preferably is 10 nm or more, further preferably is 15 nm or more, and particularly preferably is 20 nm or more. As the average primary particle size of the abrasive grains increases, the rate of polishing the object to be polished by the polishing composition is more increased.

The average primary particle size of the abrasive grains is also preferably 100 nm or less, more preferably is 80 nm or less, further preferably is 65 nm or less, and particularly preferably is 50 nm or less. As the average primary particle size decreases, the surface quality including a fine waviness of the object to be polished after having been polished by using the polishing composition becomes more adequate.

<Acid>

An acid optionally contained in the polishing composition has the function of etching the surface of an object to be polished, the function of promoting the oxidation of the surface of the object to be polished due to the oxidant, pH-buffering capability and the like. These functions of the acid increase the rate of polishing the object to be polished by the polishing composition.

A usable acid may be any one of an inorganic acid and an organic acid.

Specific examples of the inorganic acid include sulfuric acid, nitric acid, boric acid, carbonic acid, hypophosphorous acid, phosphorous acid, and phosphoric acid.

Specific examples of the organic acid other than amino acid include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, and an organic sulfonic acid such as methanesulfonic acid, ethanesulfonic acid, and isethionic acid. A salt of these acids such as an ammonium salt and an alkali metal salt may be used in combination with the acid or in place of the acid.

Specific examples of amino acid include glycine, N-methyl glycine, N,N-dimethyl glycine, L-alanine, β-alanine, L-2-aminobutyric acid, L-norvaline, L-valine, L-leucine, L-norleucine, L-isoleucine, L-alloisoleucine, L-phenylalanine, L-proline, sarcosine, L-ornithine, L-lysine, taurine, L-serine, L-threonine, L-allothreonine, L-homoserine, L-tyrosine, 3,5-diiodo-L-tyrosine, β-(3,4-dihydroxyphenyl)-L-alanine, L-thyroxine, 4-hydroxy-L-proline, L-cysteine, L-methionine, L-ethionine, L-lanthionine, L-cystathionine, L-cystine, L-cysteic acid, L-aspartic acid, L-glutamic acid, S-(carboxymethyl)-L-cysteine, 4-aminobutyric acid, L-asparagine, L-glutamine, azaserine, L-arginine, L-canavanine, L-citrulline, δ-hydroxy-L-lysine, creatine, L-kynurenine, L-histidine, 1-methyl-L-histidine, 3-methyl-L-histidine, ergothioneine, L-tryptophan, actinomycin C1, apamin, angiotensin I, angiotensin II, and antipain.

Among them, preferable acids are malic acid, tartaric acid, citric acid, glycolic acid, and isethionic acid.

The content of the acid in the polishing composition is preferably 0.001 g/L or more, more preferably is 0.01 g/L or more, and further preferably is 0.1 g/L or more. As the content of the acid increases, the rate of polishing the object to be polished by the polishing composition is more increased.

The content of the acid in the polishing composition is also preferably 50 g/L or less, more preferably is 20 g/L or less, and further preferably is 10 g/L or less. As the content of the acid decreases, excessive etching for the surface of the object to be polished by the acid is more suppressed.

<pH of Polishing Composition>

The polishing composition has preferably a pH of 4 or more, and more preferably of 7 or more. As the pH increases, the rate of polishing an object to be polished by the polishing composition is more increased. In order to obtain a desired pH, an arbitrary alkali, acid, and buffering agent may be also used.

According to the present embodiment, the following advantages are obtained.

A polishing composition according to the present embodiment contains a surfactant comprising a compound represented by Chemical Formula 1. Accordingly, the surface defects of an object to be polished after having been polished by using the polishing composition are reduced by this function of the surfactant. Thus, the polishing composition of the present embodiment is suitably used in an application of polishing for forming the wiring of a semiconductor device, particularly in an application of polishing the copper-containing surface of an object to be polished.

The above described embodiment may be modified as follows.

The polishing composition of the above described embodiment may contain two or more of oxidants.

The polishing composition of the above described embodiment may contain two or more of anticorrosives.

The polishing composition of the above described embodiment may contain two or more of surfactants.

The polishing composition of the above described embodiment may contain two or more types of abrasive grains.

The polishing composition of the above described embodiment may contain two or more of acids.

The polishing composition of the above described embodiment may further contain a chelating agent. The chelating agent is effective not only for reducing adverse effects of polyvalent metal ions that may be mixed into the polishing composition, but also for reducing scratches on the surface of the object to be polished that are caused by metal ions formed during polishing. A usable chelating agent is not limited in particular. Specific examples thereof include nitrilotriacetic acid, diethylenetriaminepentaacetic acid, ethylenediaminetetraacetic acid, N,N,N-trimethylenephosphonic acid, ethylenediamine-N,N,N',N'-tetramethylenesulfonic acid, trans-cyclohexanediaminetetraacetic acid, 1,2-diaminopropanetetraacetic acid, glycoletherdiaminetetraacetic acid, ethylenediamineorthohydroxyphenylacetic acid, ethylenediaminedisuccinic acid (SS isomer), N-(2-ethyl carboxylate)-L-aspartic acid, β-alaninediacetic acid, 2-phosphonobutane-1,2,4-tricarboxylic acid, 1-hydroxyethylidene-1,1-diphosphonic acid, N,N'-bis(2-hydroxybenzyl)ethylenediamine-N,N'-diacetic acid, and 1,2-dihydroxybenzene-4,6-disulfonic acid.

The polishing composition of the above described embodiment may further contain a water-soluble polymer. The water-soluble polymer adsorbs to the surface of the abrasive grain or the surface of the object to be polished, thereby can control the rate of polishing the object to be polished by the polishing composition. In addition, the water-soluble polymer has the function of stabilizing insoluble components formed in the polishing composition during polishing. A usable water-soluble polymer is not limited in particular. Specific examples thereof include: polysaccharides such as alginic acid, pectic acid, carboxymethyl cellulose, curdlan, and pullulan; amino acid salts such as ammonium glycinate and sodium glycinate; polycarboxylic acids and salts thereof such as polyaspartic acid, polyglutamic acid, polylysine, polymalic acid, polymethacrylic acid, ammonium polymethacrylate, sodium polymethacrylate, polyamidic acid, polymaleic acid, polyitaconic acid, polyfumaric acid, poly(p-styrene carboxylic acid), polyacrylic acid, polyacrylamide, aminopolyacrylamide, ammonium polyacrylate, sodium polyacrylate, polyamidic acid, ammonium polyamidate, sodium polyamidate, and polyglyoxylic acid; vinyl polymers such as polyvinyl alcohol, polyvinylpyrrolidone, and polyacrolein; sulfonic acids and salts thereof such as ammonium methyltaurate, sodium methyltaurate, sodium methylsulfate, ammonium ethylsulfate, ammonium butylsulfate, sodium vinylsulfonate, sodium 1-allylsulfonate, sodium 2-allylsulfonate, sodium methoxymethylsulfonate, ammonium ethoxymethylsulfonate, sodium 3-ethoxypropylsulfonate, sodium methoxymethylsulfonate, ammonium ethoxymethylsulfonate, sodium 3-ethoxypropylsulfonate, and sodium sulfosuccinate; amides such as propionamide, acrylamide, methylurea, nicotinamide, succinamide, and sulfanilamide; and polyglycerin and polyglycerol ester. Among them, preferable water-soluble polymers are pullulan, carboxymethyl cellulose, polymethacrylic acid, polyacrylic acid, polyacrylamide, polyvinyl alcohol, and polyvinylpyrrolidone, and an ester thereof and an ammonium salt thereof.

The polishing composition of the above described embodiment may further contain a known additive such as an antiseptic agent, an antifungal agent, and an anti-rust agent, as needed.

The polishing composition of the above described embodiment may be a one-component type or a multi-component type such as a two-component type.

The polishing composition of the above described embodiment may be prepared by diluting a stock solution of the polishing composition with water.

The polishing composition of the above described embodiment may be used in an application other than the application of polishing for forming the wiring of a semiconductor device.

Next, Examples of the present invention and Comparative Examples will be described.

Polishing compositions according to Examples 1 to 40 and Comparative Examples 1 to 20 were prepared by mixing corresponding respective oxidants, anticorrosives, surfactants, abrasive grains, and acids into water. The details of the surfactants and the anticorrosives in the polishing compositions of Examples 1 to 40 and Comparative Examples 1 to 20 are shown in Table 1. Each of the polishing compositions of Examples 1 to 40 and Comparative Examples 1 to 20 contained 3 g/L of hydrogen peroxide as an oxidant, 7% by mass of colloidal silica having an average primary particle size of 30 nm as abrasive grains, and 11 g/L (0.09 mol/L) of isethionic acid as acid, though they are not shown in Table 1.

Figure 1B:
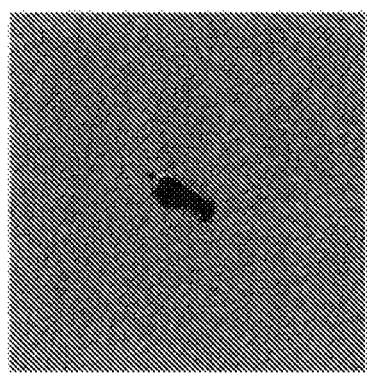

The surface of a copper blanket wafer was polished by using each polishing composition of Examples 1 to 40 and Comparative Examples 1 to 20 for 60 seconds on conditions described in Table 2, and then was cleaned. The number of defects having a size of 0.2 μm or more, which existed on the surface of each wafer that was polished and cleaned, was measured by using a surface defect inspection apparatus (SP-1 made by KLA-Tencor Corporation). Furthermore, 100 pieces of defects among these defects were selected at random on each wafer, and were observed with a scanning electron microscope (RS-4000 made by Hitachi High-Technologies Corporation). Then, the number of such particular defects was measured that the shape was an irregularly protruding shape and the secondary electron image was seen to be darker than the surface of the wafer, as is shown in scanning electron microscope photographs of FIGS. 1(a) and 1(b). The number of the particular defects on each wafer was estimated by multiplying the ratio of such particular defects occupying in 100 pieces of the defects on the wafer, which had been observed with the scanning electron microscope, by the total number of the defects on the wafer. The results were evaluated as 5 (Excellent), when the number of the particular defects that was estimated in this way was 100 pieces or less; as 4 (Very Good), when the number was 101 pieces or more and 500 pieces or less; as 3 (Good), when the number was 501 pieces or more and 1,000 or less; as 2 (Fair), when the number was 1,001 or more and 2,000 or less; and as 1 (Poor), when the number was 2,001 or more. The result of this evaluation is shown in the column entitled "defects" in Table 1. The length of one side of each photograph in FIGS. 1(a) and 1(b) corresponds to approximately 2.5 μm.

The D90 value (90% particle size) of colloidal silica in each polishing composition of Examples 1 to 40 and Comparative Examples 1 to 20 right after having been prepared and after having been stored at 40° C. for one week after the preparation were measured with a particle size distribution measurement instrument (UPA-UT151 made by Nikkiso Co., Ltd.). The value D90 is the size of the particle that is lastly summed up when the volume of colloidal silica particles in each polishing composition is accumulated from particles of the smallest size in ascending order until the accumulated volume reaches 90% or more of the total volume of all the colloidal silica particles. The results were evaluated as 5 (Excellent), when the value obtained by dividing the value D90 measured on each polishing composition after having been stored in one week by the value D90 measured on the same polishing composition right after having been prepared is 1.05 or less; as 4 (Very Good), when the value was 1.06 or more and 1.10 or less; as 3 (Good), when the value was 1.11 or more and 1.20 or less; as 2 (Fair), when the value was 1.21 or more and 1.50 or less; and as 1 (Poor), when the value was 1.51 or more. The result of this evaluation is shown in the column entitled "dispersibility" in Table 1.

TABLE 1

| | Surfactant | | Anticorrosive | | | |
|---|---|---|---|---|---|---|
| | Name | Content (g/L) | Name | Content (g/L) | Defects | Dispersibility |
| Example 1 | polyoxyethylene monostyrylphenyl ether sulfate | 0.1 | 1H-benzotriazole | 0.6 | 5 | 5 |
| Example 2 | polyoxyethylene distyrylphenyl ether sulfate | 0.1 | 1H-benzotriazole | 0.6 | 5 | 5 |
| Example 3 | polyoxyethylene tristyrylphenyl ether sulfate | 0.1 | 1H-benzotriazole | 0.6 | 5 | 5 |
| Example 4 | polyoxyethylene tristyrylphenyl ether sulfate | 0.01 | 1H-benzotriazole | 0.6 | 4 | 5 |
| Example 5 | polyoxyethylene tristyrylphenyl ether sulfate | 1 | 1H-benzotriazole | 0.6 | 5 | 5 |
| Example 6 | polyoxyethylene tristyrylphenyl ether sulfate | 0.1 | 1-hydroxybenzotriazole monohydrate | 0.7 | 5 | 5 |
| Example 7 | polyoxyethylene tristyrylphenyl ether sulfate | 0.1 | 1-aminobenzotriazole | 0.7 | 5 | 5 |
| Example 8 | polyoxyethylene tristyrylphenyl ether sulfate | 0.1 | 5-chloro-1H-benzotriazole | 0.8 | 5 | 5 |
| Example 9 | polyoxyethylene tristyrylphenyl ether sulfate | 0.1 | 5-nitro-1H-benzotriazole | 0.8 | 5 | 5 |
| Example 10 | polyoxyethylene tristyrylphenyl ether sulfate | 0.1 | 5-carboxy-1H-benzotriazole | 0.8 | 5 | 5 |

TABLE 1-continued

| | Surfactant | | Anticorrosive | | | |
|---|---|---|---|---|---|---|
| | Name | Content (g/L) | Name | Content (g/L) | Defects | Dispersibility |
| Example 11 | polyoxyethylene tristyrylphenyl ether sulfate | 0.1 | 5,6-dimethyl-1H-benzotriazole | 0.7 | 5 | 5 |
| Example 12 | polyoxyethylene tristyrylphenyl ether sulfate | 0.1 | 5-methyl-1H-benzotriazole | 0.7 | 5 | 5 |
| Example 13 | polyoxyethylene tristyrylphenyl ether sulfate | 0.1 | 1-(1',2'-dicarboxyethyl) benzotriazole | 1.2 | 5 | 5 |
| Example 14 | polyoxyethylene tristyrylphenyl ether sulfate | 0.1 | 1-(hydroxymethyl) benzotriazole | 0.7 | 5 | 5 |
| Example 15 | polyoxyethylene tristyrylphenyl ether sulfate | 0.1 | 1-[N,N-bis(hydroxyethyl) aminomethyl]benzotriazole | 1.3 | 5 | 5 |
| Example 16 | polyoxyethylene tristyrylphenyl ether sulfate | 0.1 | 1-[N,N-bis(hydroxyethyl) aminomethyl]-5-methylbenzotriazole | 1.3 | 5 | 5 |
| Example 17 | polyoxyethylene tristyrylphenyl ether sulfate | 0.1 | 1,2,4-triazole | 0.3 | 5 | 5 |
| Example 18 | polyoxyethylene tristyrylphenyl ether sulfate | 0.1 | benzimidazole | 0.6 | 5 | 5 |
| Example 19 | polyoxyethylene tristyrylphenyl ether sulfate | 0.1 | indazole | 0.6 | 5 | 5 |
| Example 20 | polyoxyethylene tristyrylphenyl ether sulfate | 0.1 | indole | 0.6 | 5 | 5 |
| Example 21 | polyoxyethylene tristyrylphenyl ether sulfate | 0.1 | 5-nitro-1H-indole | 0.8 | 5 | 5 |
| Example 22 | polyoxyethylene tristyrylphenyl ether sulfate | 0.1 | allopurinol | 0.7 | 5 | 5 |
| Example 23 | polyoxyethylene tristyrylphenyl ether sulfate | 0.1 | 3-amino-5-phenylpyrazole | 0.8 | 5 | 5 |
| Example 24 | polyoxyethylene tristyrylphenyl ether phosphate | 0.1 | benzotriazole | 0.6 | 5 | 5 |
| Example 25 | polyoxypropylene tristyrylphenyl ether sulfate | 0.1 | benzotriazole | 0.6 | 5 | 4 |
| Example 26 | polyoxyethylene polyoxypropylene tristyrylphenyl ether sulfate | 0.1 | benzotriazole | 0.6 | 5 | 5 |
| Example 27 | polyoxyethylene dimethylstyrylphenyl ether sulfate | 0.1 | benzotriazole | 0.6 | 5 | 5 |
| Example 28 | polyoxypropylene dimethylstyrylphenyl ether sulfate | 0.1 | benzotriazole | 0.6 | 5 | 4 |
| Example 29 | polyoxypropylene polyoxyethylene tristyrylphenyl ether sulfate | 0.1 | benzotriazole | 0.6 | 5 | 5 |
| Example 30 | polyoxyethylene tristyrylphenyl ether | 0.1 | benzotriazole | 0.6 | 5 | 2 |
| Example 31 | polyoxypropylene tristyrylphenyl ether | 0.1 | benzotriazole | 0.6 | 5 | 2 |
| Example 32 | polyoxyethylene nonylphenyl ether sulfate | 0.1 | benzotriazole | 0.6 | 3 | 5 |
| Example 33 | polyoxyethylene nonylphenyl ether | 0.1 | benzotriazole | 0.6 | 3 | 2 |
| Example 34 | polyoxyethylene dodecylphenyl ether | 0.1 | benzotriazole | 0.6 | 3 | 2 |
| Example 35 | polyoxyethylene monophenyl ether | 0.1 | benzotriazole | 0.6 | 2 | 2 |
| Example 36 | polyoxypropylene monomethylphenyl ether | 0.1 | benzotriazole | 0.6 | 2 | 2 |
| Example 37 | polyoxyethylene oleylphenyl ether | 0.1 | benzotriazole | 0.6 | 3 | 2 |
| Example 38 | polyoxyethylene benzylphenyl ether | 0.1 | benzotriazole | 0.6 | 4 | 2 |
| Example 39 | polyoxyethylene cumylphenyl ether sulfate | 0.1 | benzotriazole | 0.6 | 5 | 5 |
| Example 40 | polyoxypropylene cumylphenyl ether sulfate | 0.1 | benzotriazole | 0.6 | 5 | 4 |
| Comparative Example 1 | dodecylbenzenesulfonic acid | 0.1 | benzotriazole | 0.6 | 1 | 5 |
| Comparative Example 2 | dodecyldiphenyl ether monosulfonate | 0.1 | benzotriazole | 0.6 | 1 | 5 |
| Comparative Example 3 | dodecyldiphenyl ether disulfonate | 0.1 | benzotriazole | 0.6 | 1 | 5 |
| Comparative Example 4 | triisopropylnaphthalenesulfonic acid | 0.1 | benzotriazole | 0.6 | 1 | 5 |
| Comparative Example 5 | polyoxyethylene alkyl ether sulfate | 0.1 | benzotriazole | 0.6 | 1 | 5 |
| Comparative Example 6 | lauric acid | 0.1 | benzotriazole | 0.6 | 1 | 5 |
| Comparative | polyoxyethylene lauryl ether acetate | 0.1 | benzotriazole | 0.6 | 1 | 5 |

TABLE 1-continued

| | | Surfactant | | Anticorrosive | | |
| --- | --- | --- | --- | --- | --- | --- |
| | Name | Content (g/L) | Name | Content (g/L) | Defects | Dispersibility |
| Example 7 | | | | | | |
| Comparative Example 8 | polyoxyethylene lauryl ether phosphate | 0.1 | benzotriazole | 0.6 | 1 | 5 |
| Comparative Example 9 | dipolyoxyethylene lauryl ether phosphate | 0.1 | benzotriazole | 0.6 | 1 | 5 |
| Comparative Example 10 | tripolyoxyethylene lauryl ether phosphate | 0.1 | benzotriazole | 0.6 | 1 | 5 |
| Comparative Example 11 | coconut oil fatty acid sarcosine | 0.1 | benzotriazole | 0.6 | 1 | 5 |
| Comparative Example 12 | polyoxyethylene lauroylethanolamide sulfosuccinate | 0.1 | benzotriazole | 0.6 | 1 | 5 |
| Comparative Example 13 | coconut oil fatty acid methyltaurine | 0.1 | benzotriazole | 0.6 | 1 | 5 |
| Comparative Example 14 | laurylaminodipropionic acid | 0.1 | benzotriazole | 0.6 | 1 | 5 |
| Comparative Example 15 | polyoxyethylene lauryl ether | 0.1 | benzotriazole | 0.6 | 1 | 2 |
| Comparative Example 16 | polyoxyethylene behenyl ether | 0.1 | benzotriazole | 0.6 | 1 | 2 |
| Comparative Example 17 | polyoxyethylene sorbitan monooleate | 0.1 | benzotriazole | 0.6 | 1 | 2 |
| Comparative Example 18 | polyoxyethylene oleyl amino ether | 0.1 | benzotriazole | 0.6 | 1 | 2 |
| Comparative Example 19 | polyoxyethylene oleic amide | 0.1 | benzotriazole | 0.6 | 1 | 2 |
| Comparative Example 20 | — | — | benzotriazole | 0.6 | 1 | 5 |

TABLE 2

Polishing machine: "REFREXION LK" made by Applied Materials, Inc.
Polishing pad: "IC-1010 M groove" made by Rohm and Haas Company
Polishing pressure: approximately 11 kPa (=1.5 psi)
Number of revolutions of surface plate: 83 rpm
Number of revolutions of head: 77 rpm
Supply rate of polishing composition: 300 mL/min.
Conditioning: In-situ (A-165 diamond conditioner made by 3M Company)
Wafer cleaning: Scrub-cleaning with a brush made from polyvinyl alcohol
Cleaning solution: MCX-SDR4 made by Mitsubishi Chemical Corporation, 30 times dilution

The invention claimed is:

1. A polishing composition comprising an oxidant, an anticorrosive, and a surfactant, the surfactant being a compound represented by Chemical Formula 1:

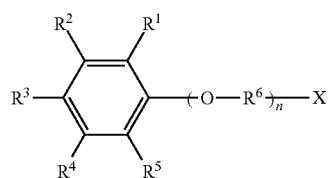

wherein one to three of $R^1$ to $R^5$ in Chemical Formula 1 are functional groups represented by Chemical Formula 2:

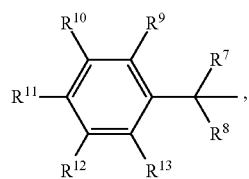

another one of $R^1$ to $R^5$ is a hydrogen atom or an alkyl group having 1 to 9 carbon atoms, and the remainder are hydrogen atoms, O—$R^6$ is oxyethylene, oxypropylene, or a random or block conjugate of oxyethylene and oxypropylene, n is an integer of 1 or more, X is an $OSO_3^-$ group, an $OPO_3^{2-}$ group, or an OH group, and $R^7$ to $R^{13}$ in Chemical Formula 2 are hydrogen atoms or methyl groups.

2. The polishing composition according to claim 1, wherein X in Chemical Formula 1 is an $OSO_3^-$ group or an $OPO_3^{2-}$ group.

3. The polishing composition according to claim 1, wherein the oxidant is peroxide.

4. The polishing composition according to claim 1, wherein the anticorrosive is a nitrogen-containing heterocyclic compound.

5. The polishing composition according to claim 1, further comprising abrasive grains of silica.

6. The polishing composition according to claim 1, further comprising an acid selected from the group consisting of malic acid, tartaric acid, citric acid, glycolic acid, and isethionic acid.

7. The polishing composition according to claim 1, further comprising a chelating agent or a water-soluble polymer.

8. The polishing composition according to claim 5, further comprising a chelating agent, water-soluble polymer, and an acid selected from the group consisting of malic acid, tartaric acid, citric acid, glycolic acid, and isethionic acid.

9. The polishing composition according to claim 8, wherein the oxidant is peroxide and wherein the anticorrosive is a nitrogen-containing heterocyclic compound.

10. The polishing composition according to claim 1, wherein the polishing composition has a pH of 7 or more.

11. The polishing composition according to claim 9, wherein the polishing composition has a pH of 7 or more.

12. A method for polishing a copper-containing surface of an object to be polished, by using the polishing composition according to claim 1.

13. The polishing composition according to claim 1, wherein the surfactant is a compound selected from the group consisting of polyoxyethylene monostyrylphenyl ether, polyoxyethylene monostyrylmethylphenyl ether, polyoxyethylene monostyrylbutylphenyl ether, polyoxyethylene monostyrylnonylphenyl ether, polyoxyethylene monomethylstyrylphenyl ether, polyoxyethylene monomethylstyrylmethylphenyl ether, polyoxyethylene monomethylstyrylbutylphenyl ether, polyoxyethylene monomethylstyrylnonylphenyl ether, polyoxyethylene distyrylphenyl ether, polyoxyethylene distyrylmethylphenyl ether, polyoxyethylene distyrylbutylphenyl ether, polyoxyethylene distyrylnonylphenyl ether, polyoxyethylene dimethylstyrylphenyl ether, polyoxyethylene dimethylstyrylmethylphenyl ether, polyoxyethylene dimethylstyrylbutylphenyl ether, polyoxyethylene dimethylstyrylnonylphenyl ether, polyoxyethylene tristyrylphenyl ether, polyoxyethylene tristyrylmethylphenyl ether, polyoxyethylene tristyrylbutylphenyl ether, polyoxyethylene tristyrylnonylphenyl ether, polyoxyethylene trimethylstyrylphenyl ether, polyoxyethylene trimethylstyrylmethylphenyl ether, polyoxyethylene trimethylstyrylbutylphenyl ether, polyoxyethylene trimethylstyrylnonylphenyl ether, polyoxyethylene cumylphenyl ether, polyoxypropylene monostyrylphenyl ether, polyoxypropylene monostyrylmethylphenyl ether, polyoxypropylene monostyrylbutylphenyl ether, polyoxypropylene monostyrylnonylphenyl ether, polyoxypropylene monomethylstyrylphenyl ether, polyoxypropylene monomethylstyrylmethylphenyl ether, polyoxypropylene monomethylstyrylbutylphenyl ether, polyoxypropylene monomethylstyrylnonylphenyl ether, polyoxypropylene distyrylphenyl ether, polyoxypropylene distyrylmethylphenyl ether, polyoxypropylene distyrylbutylphenyl ether, polyoxypropylene distyrylnonylphenyl ether, polyoxypropylene dimethylstyrylphenyl ether, polyoxypropylene dimethylstyrylmethylphenyl ether, polyoxypropylene dimethylstyrylbutylphenyl ether, polyoxypropylene dimethylstyrylnonylphenyl ether, polyoxypropylene tristyrylphenyl ether, polyoxypropylene tristyrylmethylphenyl ether, polyoxypropylene tristyrylbutylphenyl ether, polyoxypropylene tristyrylnonylphenyl ether, polyoxypropylene trimethylstyrylphenyl ether, polyoxypropylene trimethylstyrylmethylphenyl ether, polyoxypropylene trimethylstyrylbutylphenyl ether, polyoxypropylene trimethylstyrylnonylphenyl ether, polyoxypropylene cumylphenyl ether, polyoxyethylene polyoxypropylene monostyrylphenyl ether, polyoxyethylene polyoxypropylene mono styrylmethylphenyl ether, polyoxyethylene polyoxypropylene monostyrylbutylphenyl ether, polyoxyethylene polyoxypropylene monostyrylnonylphenyl ether, polyoxyethylene polyoxypropylene monomethylstyrylphenyl ether, polyoxyethylene polyoxypropylene monomethylstyrylmethylphenyl ether, polyoxyethylene polyoxypropylene monomethylstyrylbutylphenyl ether, polyoxyethylene polyoxypropylene monomethylstyrylnonylphenyl ether, polyoxyethylene polyoxypropylene distyrylphenyl ether, polyoxyethylene polyoxypropylene distyrylmethylphenyl ether, polyoxyethylene polyoxypropylene distyrylbutylphenyl ether, polyoxyethylene polyoxypropylene distyrylnonylphenyl ether, polyoxyethylene polyoxypropylene dimethylstyrylphenyl ether, polyoxyethylene polyoxypropylene dimethylstyrylmethylphenyl ether, polyoxyethylene polyoxypropylene dimethylstyrylbutylphenyl ether, polyoxyethylene polyoxypropylene dimethylstyrylnonylphenyl ether, polyoxyethylene polyoxypropylene tristyrylphenyl ether, polyoxyethylene polyoxypropylene tristyrylmethylphenyl ether, polyoxyethylene polyoxypropylene tristyrylbutylphenyl ether, polyoxyethylene polyoxypropylene tristyrylnonylphenyl ether, polyoxyethylene polyoxypropylene trimethylstyrylphenyl ether, polyoxyethylene polyoxypropylene trimethylstyrylmethylphenyl ether, polyoxyethylene polyoxypropylene trimethylstyrylbutylphenyl ether, polyoxyethylene polyoxypropylene trimethylstyrylnonylphenyl ether, polyoxyethylene polyoxypropylene cumylphenyl ether, polyoxyethylene mono styrylmethylphenyl ether sulfate, polyoxyethylene monostyrylbutylphenyl ether sulfate, polyoxyethylene monostyrylnonylphenyl ether sulfate, polyoxyethylene monomethylstyrylphenyl ether sulfate, polyoxyethylene monomethylstyrylmethylphenyl ether sulfate, polyoxyethylene monomethylstyrylbutylphenyl ether sulfate, polyoxyethylene monomethylstyrylnonylphenyl ether sulfate, polyoxyethylene cumylphenyl ether sulfate, polyoxyethylene distyrylmethylphenyl ether sulfate, polyoxyethylene distyrylbutylphenyl ether sulfate, polyoxyethylene distyrylnonylphenyl ether sulfate, polyoxyethylene dimethylstyrylphenyl ether sulfate, polyoxyethylene dimethylstyrylmethylphenyl ether sulfate, polyoxyethylene dimethylstyrylbutylphenyl ether sulfate, polyoxyethylene dimethylstyrylnonylphenyl ether sulfate, polyoxyethylene tristyrylmethylphenyl ether sulfate, polyoxyethylene tristyrylbutylphenyl ether sulfate, polyoxyethylene tristyrylnonylphenyl ether sulfate, polyoxyethylene trimethylstyrylphenyl ether sulfate, polyoxyethylene trimethylstyrylmethylphenyl ether sulfate, polyoxyethylene trimethylstyrylbutylphenyl ether sulfate, polyoxyethylene trimethylstyrylnonylphenyl ether sulfate, polyoxypropylene monostyrylmethylphenyl ether sulfate, polyoxypropylene monostyrylbutylphenyl ether sulfate, polyoxypropylene monostyrylnonylphenyl ether sulfate, polyoxypropylene monomethylstyrylphenyl ether sulfate, polyoxypropylene monomethylstyrylmethylphenyl ether sulfate, polyoxypropylene monomethylstyrylbutylphenyl ether sulfate, polyoxypropylene monomethylstyrylnonylphenyl ether sulfate, polyoxypropylene distyrylmethylphenyl ether sulfate, polyoxypropylene distyrylbutylphenyl ether sulfate, polyoxypropylene distyrylnonylphenyl ether sulfate, polyoxypropylene dimethylstyrylphenyl ether sulfate, polyoxypropylene dimethylstyrylmethylphenyl ether sulfate, polyoxypropylene dimethylstyrylbutylphenyl ether sulfate, polyoxypropylene dimethylstyrylnonylphenyl ether sulfate, polyoxypropylene tristyrylmethylphenyl ether sulfate, polyoxypropylene tristyrylbutylphenyl ether sulfate, polyoxypropylene tristyrylnonylphenyl ether sulfate, polyoxypropylene trimethylstyrylphenyl ether sulfate, polyoxypropylene trimethylstyrylmethylphenyl ether sulfate, polyoxypropylene trimethylstyrylbutylphenyl ether sulfate, polyoxypropylene trimethylstyrylnonylphenyl ether sulfate, polyoxypropylene cumylphenyl ether sulfate, polyoxyethylene polyoxypropylene monostyrylmethylphenyl ether sulfate, polyoxyethylene polyoxypropylene monostyrylbutylphenyl ether sulfate, polyoxyethylene polyoxypropylene monostyrylnonylphenyl ether sulfate, polyoxyethylene polyoxypropylene monomethylstyrylphenyl ether sulfate, polyoxyethylene polyoxypropylene monomethylstyrylmethylphenyl ether sulfate, polyoxyethylene polyoxypropylene monomethylstyrylbutylphenyl ether sulfate, polyoxyethylene polyoxypropylene monomethylstyrylnonylphenyl ether sulfate, polyoxyethylene polyoxypropylene distyrylmethylphenyl ether sulfate, polyoxyethylene polyoxypropylene distyrylbutylphenyl ether sulfate, polyoxyethylene polyoxypropylene distyrylnonylphenyl ether sulfate, polyoxyethylene polyoxypropylene dimethylstyrylphenyl ether sulfate, polyoxyethylene polyoxypropylene dimethylstyrylmethylphenyl ether sulfate, polyoxyethylene polyoxypropylene dimethylstyrylbutylphenyl ether sulfate, polyoxyethylene polyoxypropylene dimethylstyrylnonylphenyl ether sulfate, polyoxyethylene polyoxypropylene tristyrylmethylphenyl ether sulfate, polyoxyethylene polyoxypropylene tristyrylbutylphenyl ether sulfate, polyoxyethylene polyoxypropylene tristyrylnonylphenyl ether sulfate, polyoxyethylene polyoxypropylene trimethylstyrylphenyl ether sulfate, polyoxyethylene polyoxypropylene trimethylstyrylmethylphenyl ether sulfate, polyoxyethylene polyoxypropylene trimethylstyrylbutylphenyl ether sulfate, polyoxyethylene polyoxypropylene trimethylstyrylnonylphenyl ether sulfate, polyoxyethylene polyoxypropylene cumylphenyl ether sulfate, polyoxyethylene monostyrylmethylphenyl ether phosphate, polyoxyethylene monostyrylbutylphenyl ether phosphate, polyoxyethylene monostyrylnonylphenyl ether phosphate, polyoxyethylene monomethylstyrylphenyl ether phosphate, polyoxyethylene monomethylstyrylmethylphenyl ether phosphate, polyoxyethylene monomethylstyrylbutylphenyl ether phosphate, polyoxyethylene monomethylstyrylnonylphenyl ether phosphate, polyoxyethylene cumylphenyl ether phosphate, polyoxyethylene distyrylmethylphenyl ether phosphate, polyoxyethylene distyrylbutylphenyl ether phosphate, polyoxyethylene distyrylnonylphenyl ether phosphate, polyoxyethylene dimethylstyrylphenyl ether phosphate, polyoxyethylene dimethylstyrylmethylphenyl ether phosphate, polyoxyethylene dimethylstyrylbutylphenyl ether phosphate, polyoxyethylene dimethylstyrylnonylphenyl ether phosphate, polyoxyethylene tristyrylmethylphenyl ether phosphate, polyoxyethylene tristyrylbutylphenyl ether phosphate, polyoxyethylene tristyrylnonylphenyl ether phosphate, polyoxyethylene trimethylstyrylphenyl ether phosphate, polyoxyethylene trimethylstyrylmethylphenyl ether phosphate, polyoxyethylene trimethylstyrylbutylphenyl ether phosphate, polyoxyethylene trimethylstyrylnonylphenyl ether phosphate, polyoxypropylene monostyrylmethylphenyl ether phosphate, polyoxypropylene monostyrylbutylphenyl ether phosphate, polyoxypropylene monostyrylnonylphenyl ether phosphate, polyoxypropylene monomethylstyrylphenyl ether phosphate, polyoxypropylene monomethylstyrylmethylphenyl ether phosphate, polyoxypropylene monomethylstyrylbutylphenyl ether phosphate, polyoxypropylene monomethylstyrylnonylphenyl ether phosphate, polyoxypropylene distyrylmethylphenyl ether phosphate, polyoxypropylene distyrylbutylphenyl ether phosphate, polyoxypropylene distyrylnonylphenyl ether phosphate, polyoxypropylene dimethylstyrylphenyl ether phosphate, polyoxypropylene dimethylstyrylmethylphenyl ether phosphate, polyoxypropylene dimethylstyrylbutylphenyl ether phosphate, polyoxypropylene dimethylstyrylnonylphenyl ether phosphate, polyoxypropylene tristyrylmethylphenyl ether phosphate, polyoxypropylene tristyrylbutylphenyl ether phosphate, polyoxypropylene tristyrylnonylphenyl ether phosphate, polyoxypropylene trimethylstyrylphenyl ether phosphate, polyoxypropylene trimethylstyrylmethylphenyl ether phosphate, polyoxypropylene trimethylstyrylbutylphenyl ether phosphate, polyoxypropylene trimethylstyrylnonylphenyl ether phosphate, polyoxypropylene cumylphenyl ether phosphate, polyoxyethylene polyoxypropylene monostyrylmethylphenyl ether phosphate, polyoxyethylene polyoxypropylene monostyrylbutylphenyl ether phosphate, polyoxyethylene polyoxypropylene monostyrylnonylphenyl ether phosphate, polyoxyethylene polyoxypropylene monomethylstyrylphenyl ether phosphate, polyoxyethylene polyoxypropylene monomethylstyrylmethylphenyl ether phosphate, polyoxyethylene polyoxypropylene monomethylstyrylbutylphenyl ether phosphate, polyoxyethylene polyoxypropylene monomethylstyrylnonylphenyl ether phosphate, polyoxyethylene polyoxypropylene distyrylmethylphenyl ether phosphate, polyoxyethylene polyoxypropylene distyrylbutylphenyl ether phosphate, polyoxyethylene polyoxypropylene distyrylnonylphenyl ether phosphate, polyoxyethylene polyoxypropylene dimethylstyrylphenyl ether phosphate, polyoxyethylene polyoxypropylene dimethylstyrylmethylphenyl ether phosphate, polyoxyethylene polyoxypropylene dimethylstyrylbutylphenyl ether phosphate, polyoxyethylene polyoxypropylene dimethylstyrylnonylphenyl ether phosphate, polyoxyethylene polyoxypropylene tristyrylmethylphenyl ether phosphate, polyoxyethylene polyoxypropylene tristyrylbutylphenyl ether phosphate, polyoxyethylene polyoxypropylene tristyrylnonylphenyl ether phosphate, polyoxyethylene polyoxypropylene trimethylstyrylphenyl ether phosphate, polyoxyethylene polyoxypropylene trimethylstyrylmethylphenyl ether phosphate, polyoxyethylene polyoxypropylene trimethylstyrylbutylphenyl ether phosphate, polyoxyethylene polyoxypropylene trimethylstyrylnonylphenyl ether phosphate, polyoxyethylene polyoxypropylene cumylphenyl ether phosphate, polyoxyethylene monostyrylphenyl ether sulfate, polyoxyethylene distyrylphenyl ether sulfate, polyoxyethylene tristyrylphenyl ether sulfate, polyoxypropylene monostyrylphenyl ether sulfate, polyoxypropylene distyrylphenyl ether sulfate, polyoxypropylene tristyrylphenyl ether sulfate, polyoxyethylene polyoxypropylene monostyrylphenyl ether sulfate, polyoxyethylene polyoxypropylene distyrylphenyl ether sulfate, polyoxyethylene polyoxypropylene tristyrylphenyl ether sulfate, polyoxyethylene monostyrylphenyl ether phosphate, polyoxyethylene distyrylphenyl ether phosphate, polyoxyethylene tristyrylphenyl ether phosphate, polyoxypropylene monostyrylphenyl ether phosphate, polyoxypropylene distyrylphenyl ether phosphate, polyoxypropylene tristyrylphenyl ether phosphate, polyoxyethylene polyoxypropylene monostyrylphenyl ether phosphate, polyoxyethylene polyoxypropylene distyrylphenyl ether phosphate, and polyoxyethylene polyoxypropylene tristyrylphenyl ether phosphate.

14. The polishing composition according to claim 1, wherein the surfactant is a compound selected from the group consisting of polyoxyethylene monostyrylphenyl ether sulfate, polyoxyethylene distyrylphenyl ether sulfate, polyoxyethylene tristyrylphenyl ether sulfate, polyoxyethylene tristyrylphenyl ether phosphate, polyoxypropylene tristyrylphenyl ether sulfate, polyoxyethylene polyoxypropylene tristyrylphenyl ether sulfate, polyoxyethylene dimethylstyrylphenyl ether sulfate, polyoxypropylene dimethylstyrylphenyl ether sulfate, polyoxypropylene polyoxyethylene tristyrylphenyl ether sulfate, polyoxyethylene tristyrylphenyl ether, polyoxypropylene tristyrylphenyl ether, polyoxyethylene cumylphenyl ether sulfate, and polyoxypropylene cumylphenyl ether sulfate.

15. The polishing composition according to claim 1, wherein the anticorrosive is a compound selected from the group consisting of 1,2,4-triazole, benzimidazole, indazole, indole, 5-nitro-1H-indole, allopurinol, and 3-amino-5-phenylpyrazole.

16. The polishing composition according to claim 1, wherein the anticorrosive is a compound selected from the group consisting of 3-amino-5-phenylpyrazole, 1H-benzotriazole, 5-methyl-1H-benzotriazole, 5,6-dimethyl-1H-benzotriazole, 1-[N,N-bis(hydroxyethyl)aminomethyl]-5-methyl benzotriazole, 1,2,4-triazole, and 5-nitro-1H-indole.

* * * * *